(12) United States Patent
Cappelletti et al.

(10) Patent No.: US 12,402,328 B2
(45) Date of Patent: Aug. 26, 2025

(54) SWITCHING CELL WITH DIRECT CONTACT TO FIXED RESISTOR ELEMENT

(71) Applicant: STMicroelectronics S.r.l., Agrate Brianza (IT)

(72) Inventors: Paolo Giuseppe Cappelletti, Seveso (IT); Andrea Redaelli, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 786 days.

(21) Appl. No.: 17/581,557

(22) Filed: Jan. 21, 2022

(65) Prior Publication Data
US 2022/0238603 A1 Jul. 28, 2022

(30) Foreign Application Priority Data

Jan. 27, 2021 (FR) ..................................... 2100747

(51) Int. Cl.
*H10B 63/00* (2023.01)
*H10B 61/00* (2023.01)

(52) U.S. Cl.
CPC ............. *H10B 63/24* (2023.02); *H10B 61/10* (2023.02)

(58) Field of Classification Search
CPC ........ H10B 63/24; H10B 61/10; H10B 63/10; H10B 63/80; H10N 70/20; H10N 70/801; H10N 70/826; H10N 70/882; G11C 7/1006; G11C 7/12; G11C 8/08
USPC .......................................................... 257/2
See application file for complete search history.

(56) References Cited

U.S. PATENT DOCUMENTS

| 2012/0025164 | A1* | 2/2012 | Deweerd | G11C 13/0011 |
| | | | | 257/E45.002 |
| 2017/0117328 | A1* | 4/2017 | Terai | H10N 70/231 |
| 2017/0243922 | A1 | 8/2017 | Eun | |
| 2019/0013357 | A1* | 1/2019 | Kim | H10N 70/884 |
| 2019/0035851 | A1* | 1/2019 | Tortorelli | H10B 63/24 |
| 2020/0052036 | A1* | 2/2020 | Ikarashi | H10N 70/882 |
| 2020/0075853 | A1* | 3/2020 | Yu | H10N 70/061 |
| 2020/0098825 | A1 | 3/2020 | Boivin | |
| 2020/0202928 | A1 | 6/2020 | Pio | |
| 2020/0395410 | A1* | 12/2020 | Grobis | G11C 13/0004 |

(Continued)

FOREIGN PATENT DOCUMENTS

| CN | 107104123 A | 8/2017 |
| CN | 217361136 U | 9/2022 |
| EP | 4036997 A1 | 8/2022 |

OTHER PUBLICATIONS

INPI Search Report and Written Opinion for priority application, FR 2100747, report dated Jan. 27, 2021, 8 pages.

(Continued)

*Primary Examiner* — Mohammad M Hoque
(74) *Attorney, Agent, or Firm* — Crowe & Dunley LLC

(57) ABSTRACT

An electronic cell includes an integrated stack of structures including, successively: a first electrode; an ovonic threshold switch layer below the first electrode; and a fixed resistor below the ovonic threshold switch layer. A second electrode may be included between fixed resistor and the ovonic threshold switch layer. A memory layer, for example a phase change material layer, a resistive random-access memory layer or a magneto-resistive random-access memory layer, may be included between the first electrode and the ovonic threshold switch layer.

18 Claims, 6 Drawing Sheets

(56) References Cited

U.S. PATENT DOCUMENTS

2021/0035629 A1     2/2021   Kim
2022/0238603 A1     7/2022   Cappelletti et al.

OTHER PUBLICATIONS

EP First Office Action for counterpart EP Appl. No. 22152949.8, report dated Apr. 29, 2024, 4 pgs.
CN First Office Action and Search Report for counterpart CN Appl. No. 202210097076.5, report dated Jul. 10, 2025, 12 pages.

* cited by examiner

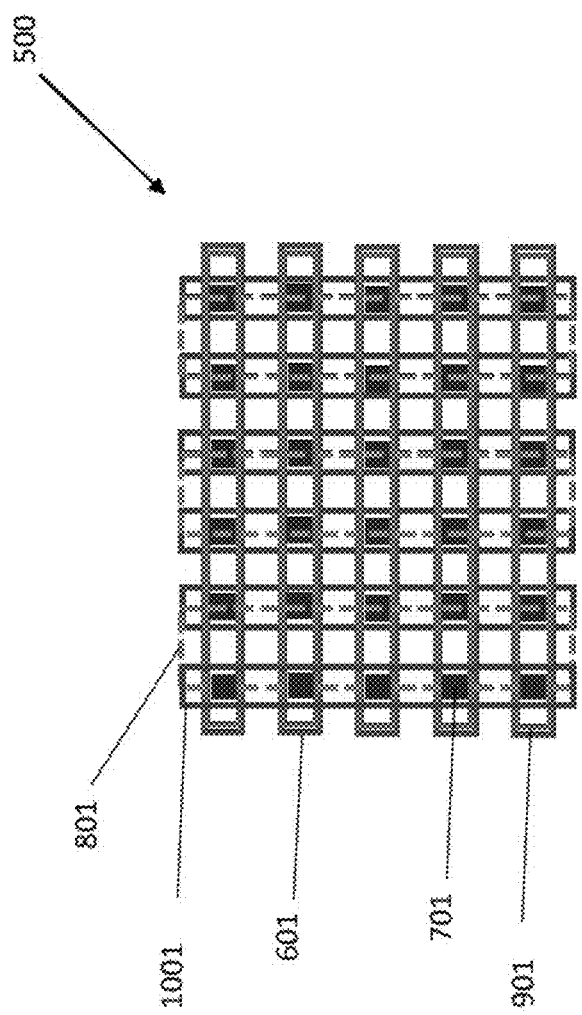

SWITCHING CELL WITH DIRECT CONTACT TO FIXED RESISTOR ELEMENT

PRIORITY CLAIM

This application claims the priority benefit of French Application for Patent No. 2100747, filed on Jan. 27, 2021, the content of which is hereby incorporated by reference in its entirety to the maximum extent allowable by law.

TECHNICAL FIELD

The present disclosure relates generally to electronic devices and more precisely to integrated switching cells arranged in arrays. The present disclosure specifically concerns ovonic threshold switching (OTS) devices.

BACKGROUND

Among the chalcogenide materials, two categories are currently studied for use in electronic devices and more particularly in the manufacturing of switching devices and memories. In particular, a distinction is made between electron switching materials without memory effect (ovonic threshold switch (OTS) materials) and phase change materials. Both materials can be used in thin film in the electronic integrated devices.

An OTS material toggles between an "on" and "off" state depending on the amount of voltage potential applied across the cell. The state of the ovonic threshold switch changes when a voltage through the ovonic threshold switch exceeds a threshold voltage. Once the threshold voltage is reached, the "on" state is triggered and the ovonic threshold switch is in a substantially conductive state. If the current or voltage potential drops below the threshold value, the ovonic threshold switch returns to the "off" state.

Phase-change materials are materials which can switch, under the effect of heat, between a crystalline phase and an amorphous phase. Since the electric resistance of an amorphous material is significantly greater than the electric resistance of a crystalline material, such a phenomenon may be useful to define two memory states, differentiated by the resistance measured through the phase-change material. The most common phase-change materials used in phase change memories are alloys made up of germanium, of antimony, and of tellurium.

Ovonic threshold switches would be useful as selecting devices thanks to their driving current capabilities in "on" state and current ratio between "on" and "off" states. However, ovonic threshold switches suffer of current overshoot at switching.

There is a need for improvement of existing integrated switching cells containing an ovonic threshold switch.

SUMMARY

One embodiment aims at overcoming all or some of the drawbacks of existing switching cells in integrated devices.

One embodiment provides an electronic cell comprising an integrated stack having successively: a first electrode; an ovonic threshold switch layer; and a resistor.

According to an embodiment, the electronic cell comprises a second electrode between the ovonic threshold switch layer and the resistor.

According to an embodiment, the electronic cell comprises a memory layer between the first electrode and the ovonic threshold switch layer.

According to an embodiment, the electronic cell comprises a barrier layer between the memory layer and the ovonic threshold switch layer.

According to an embodiment, the memory layer is made of a phase change material.

According to an embodiment, the electronic cell is a resistive random-access memory.

According to an embodiment, the electronic cell is a magneto-resistive random-access memory.

According to an embodiment, the resistor has a L-shaped cross-section.

According to an embodiment, the L-shaped cross-section of the resistor is self aligned with the shape of the ovonic threshold switch layer.

One embodiment provides an array comprising several cells as described, wherein the cells are connected to word lines by their associated resistor and to bit lines by their associated first electrode.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 10 illustrates, by a schematic view, another step of a manufacturing process of the array of memory cells illustrated in FIG. 5.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, electric connections between switching cells organized in array, and selection circuits have not been detailed, the disclosed embodiments being compatible with existing switch arrays or memory array and the corresponding addressing circuitry.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

The disclosed embodiments aim at overcoming all or part of the drawbacks of the conventional Ovonic Threshold Switch regarding the voltage snap-back, which occurs after thresholding the OTS and which causes current overshoots. The disclosed embodiments therefore provide a resistive element, electrically in series with the OTS to absorb these overshoots. More particularly, the disclosed embodiments provide a solution which allows the integration, with an OTS cell, of a series connected resistor without requiring additional surface area.

Figure 1A:
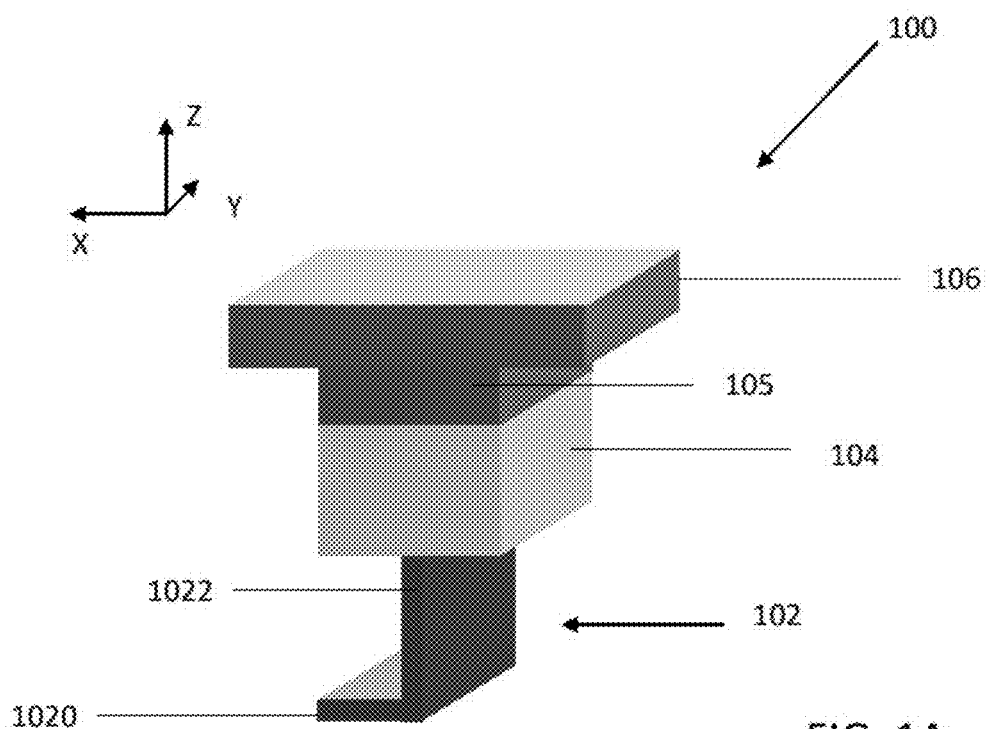
FIGS. 1A and 1B illustrate two simplified cross-section views of an embodiment of an Ovonic Threshold Switching cell.
Figure 1B:
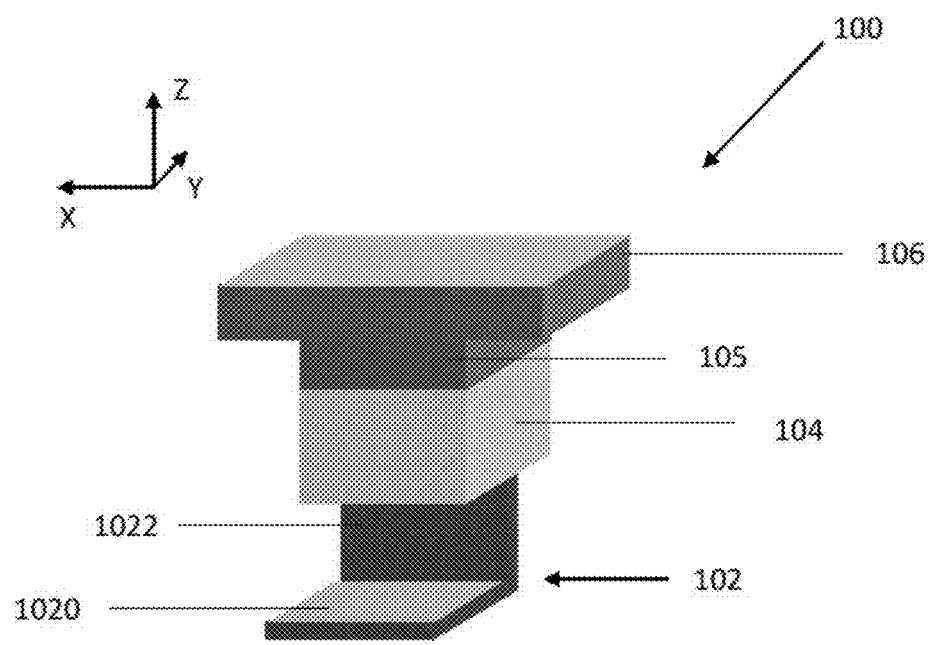

FIGS. 1A and 1B illustrate two simplified cross-section views of an embodiment of an Ovonic Threshold Switching (OTS) cell 100.

The representation of FIGS. 1A and 1B illustrates only one cell or OTS, but it should be noted that the switching cell of the present disclosure is part of a large number of integrated switching cells manufactured using thin film layers of chalcogenide materials, semiconductive materials, resistive materials, insulating materials, conductive materials, etc.

For sake of simplification, reference is made to layers to designate the corresponding elements of a stack forming the switching cell. It should however be understood that the corresponding layers correspond, in practice, to thin films deposited and etched to form individual switching elements separated by insulating trenches and arranged, for example in arrays. The terminals or electrodes of each switching cell may be interconnected, for example in lines and in columns, by corresponding layers of the stack.

A cell 100 comprises a resistor 102 or resistive element having a fixed (i.e., non-variable) resistance value, an ovonic threshold switch (OTS) layer 104, a top electrode 105 and a conductive layer 106, connected to the top electrode 105. The OTS layer 104 is located between the resistor 102 and the top electrode 105.

The OTS layer 104 has the property of exhibiting a significant decrease of resistivity when the voltage applied between the conductive layer 106 and the resistor 102 exceeds a threshold voltage VTH. This decrease (or increase) triggered by the voltage which is applied between the top and the bottom of the layer allows to consider the layer as forming a switch between an "off" state and an "on" state. If the voltage applied to OTS layer 104 is lower than the threshold VTH of the OTS layer 104, then the OTS layer 104 remains in the "off" or highly resistive state. In such a state, only a leakage current flows through the cell 100. If a voltage higher than the threshold VTH is applied, then the OTS layer 104 switches to the "on" state and operates in a relatively low resistive state. In the "on" state, a current flows through the cell 100. The threshold voltage VTH of the OTS layer 104 is, for example, inclusively between 0.5 V to 5 V.

The OTS layer 104 is, for example, made of a chalcogenide material, for example, chosen within the flowing list: germanium (Ge), tellurium (Te), selenium (Se), tungsten (W), antimony (Sb), arsenic (As), indium (In), sulfur (S) or any combination or alloy of these materials. The OTS layer 104 is made of a material the phase (crystalline) of which does not change upon the application of energy.

The OTS layer 104 has, for example, a thickness inclusively between 10 nm and 100 nm, preferably, between 20 nm and 40 nm.

Examples of ovonic materials adapted to form OTS layer 104 can be found in U.S. Pat. No. 8,148,707 (corresponding to European Patent No. 2204851), the content of which is hereby incorporated by reference to the extent authorized by law.

The top electrode 105 typically forms an electrode (to be connected to the bit line) of the cell 100 while the resistor 102 forms another electrode (to be connected to the word line) of the cell 100.

The top electrode 105 is connected to the conductive layer 106. The conductive layers 106 form the bit lines. The top electrode 105 and the conductive layer 106 are, for example, in direct contact. The conductive layer 106 is, for example, connected to the top electrode 105 through a conductive via smaller than the top electrode 105 and made, for example, of tungsten.

The conductive layer 106 has, for example, the same width as, or a larger width than, one of the dimensions of the top electrode 105.

Each cell comprises one OTS layer 104 and one top electrode 105, which are separated from the OTS layers 104 and the top electrodes 105 of the adjacent cells by an insulating layer, not shown. Each OTS layer 104 is "fully confined", which means that the OTS layer 104 of each cell is separated from the OTS layers 104 of the adjacent cells by insulating material. The OTS layer 104 and the top electrode 105 have, for example, a parallelepipedal shape having, for example, for both layers the same width and the same length.

The resistor 102 has, for example, an L-shaped cross-section. The resistor 102 has then a horizontal portion 1020 and a vertical portion 1022. The resistor 102 is, for example, surrounded by an insulating layer, not shown. The thickness of this insulating layer is such that the upper surface of the vertical portion 1022 of the resistor 102 is coplanar with the upper surface of the insulating layer. The resistor 102 has, in FIGS. 1A and 1B, a L-shaped cross-section, but the shape of the resistor 102 can easily be adapted within a squared-shaped cross-section or any other shapes. The resistor 102 is, for example, in contact with the OTS layer 104.

The top electrode 105 and the resistor 102 are, for example, made of any refractory metal and/or refractory metal nitride, such as carbon (C), carbon nitride ((CN)n), titanium (Ti), titanium nitride (TiN), titanium silicon nitride (TiSiN), tungsten (W), tungsten nitride ($W_2N$, WN, $WN_2$), tungsten carbon nitride, tungsten silicon nitride, tantalum (Ta), tantalum nitride (TaN), tantalum silicon nitride, tantalum tungsten, or any combination or alloy of these materials. The top electrode 105 and the resistor 102 are, for example, made of the same materials. The top electrode 105 and the resistor 102 are, for example, made of two different materials.

The top electrode 105 and the conductive layer 106 may be made of the same conductive material or of different conductive materials. The conductive layer 106 is, for example, made of copper.

The embodiments of FIGS. 1A, 1B, 2A, 2B, 3 and 4 are shown in space following an orthogonal spatial system XYZ in which the axis Z is orthogonal to the top face of the conductive layer 106 of the cell 100.

In the embodiment of FIGS. 1A and 1B, the top conductive layer 106 extends horizontally along the direction X. In the example of FIG. 1A, the vertical portion 1022 of the resistor 102 is preferably centered with respect to the cell 100 and extends vertically along the direction Y. In the example of FIG. 1B, the vertical portion 1022 of the resistor 102 is preferably centered with respect to the cell 100 and extends vertically along the direction X.

The difference between FIGS. 1A and 1B is therefore the orientation of the L-shaped resistor. FIG. 1A is called a "self-aligned wall" cell architecture, in which the resistor 102 width is equal to the conductive layer 106 width. In FIG. 1A, the resistor 102 and the conductive layer 106 are, for example, formed using the same masking layer and in the same direction.

FIG. 1B corresponds to a use of the "self-aligned wall technology" in a different way, in which the width of resistor 102 is not equal to the width of the conductive layer 106. In FIG. 1B, the resistor 102, the OTS layer 104 and the top electrode 105 are, for example, formed using the same masking layer as the one used to form the conductive layer 106 but oriented in the perpendicular direction compared to the direction of the conductive layer 106. The cell architecture of FIG. 1B allows to integrate a resistor 102 into an OTS device with no area penalty at the cost of one not critical additional mask and few additional process steps.

In both FIG. 1A and FIG. 1B, the interconnection (not shown) of the foot 1020 of each resistor 102 is perpendicular to the interconnection of the conductive layers 106. In other words, if the conductive layer 106 is organized in columns, the bottom electrode is organized in rows.

An advantage of the present embodiments is that the resistor 102 is not external to the cell 100 but is part of an integrated to cell 100.

Figure 2A:
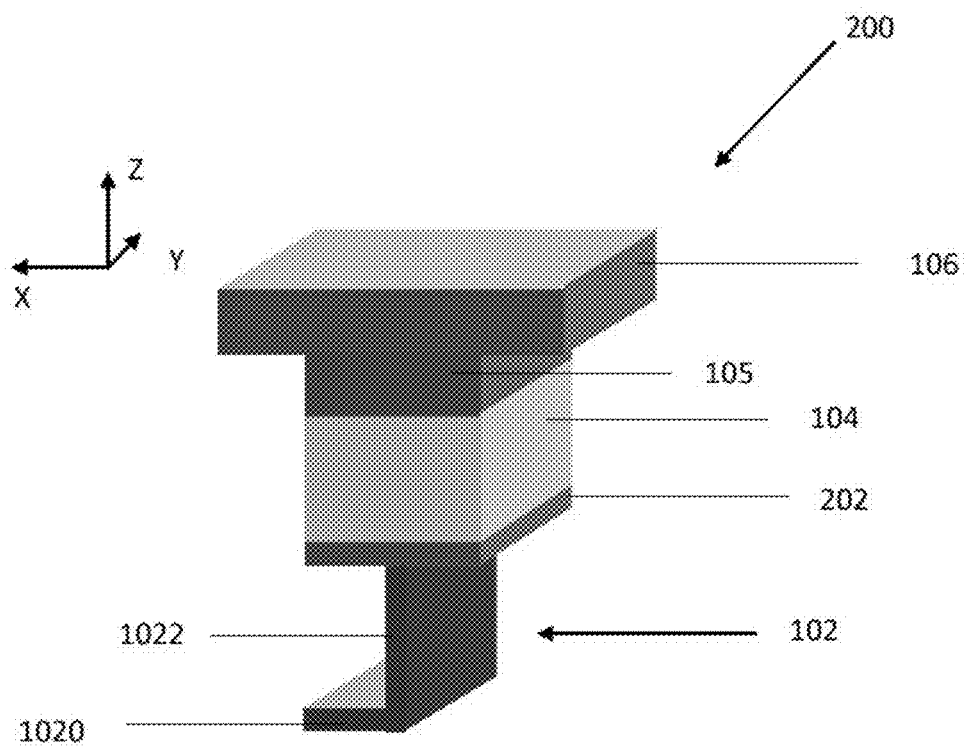
FIGS. 2A and 2B illustrate two simplified cross-section views of another embodiment of an Ovonic Threshold Switching cell.
Figure 2B:
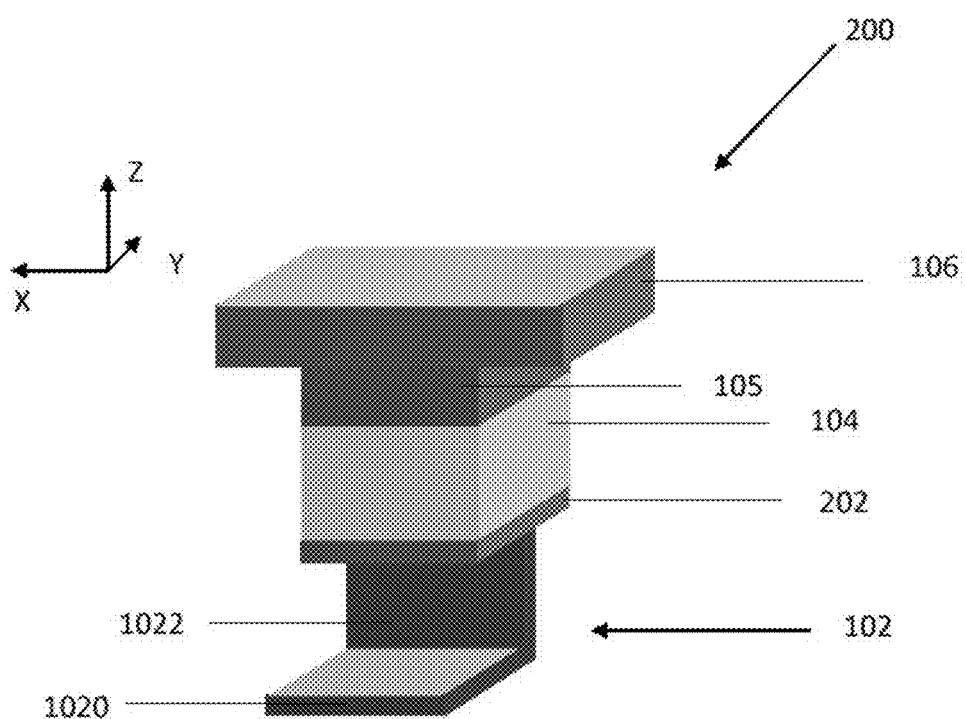

FIGS. 2A and 2B illustrates two simplified cross-section views of another embodiment of an Ovonic Threshold Switching cell 200.

The cell 200 illustrated in FIGS. 2A, 2B is similar to the cell 100 illustrated in FIGS. 1A, 1B with the difference that the cell 200 comprises a local bottom electrode 202. The bottom electrode 202 is, for example, located below the OTS layer 104, that means that the bottom electrode 202 is located between the resistor 102 and the OTS layer 104. The bottom electrode 202 extends, for example, below the entire surface of the OTS layer 104, that means that the bottom electrode 202 has the same length and the same width than the length and the width of the OTS layer 104. The resistor 102 is, for example, in contact with the bottom electrode 202 which is in contact with the OTS layer 104.

The local bottom electrode 202 provides a uniformization of the electrical current flow in all the surface of the OTS layer 104.

The bottom electrode 202 is, for example, made of any conductive material, such as carbon (C) or carbon nitride ((CN)n). The bottom electrode 202 is, for example, not made of a metal or a combination of metals.

The bottom electrode 202 has, for example, a thickness inclusively between 1 nm and 10 nm and preferably, between 4 nm and 6 nm.

In the example of FIG. 2A, the vertical portion 1022 of the resistor 102 is preferably centered with respect to the cell 200 and extends vertically along the direction Y.

In the example of FIG. 2B, the vertical portion 1022 of the resistor 102 is preferably centered with respect to the cell 200 and extends vertically along the direction X.

The provision of a resistor 102 integrated with an OTS cell offer new integration opportunities for various devices. In particular, this allows the integration of a switch with a memory cell at no cost of additional area.

Figure 3:
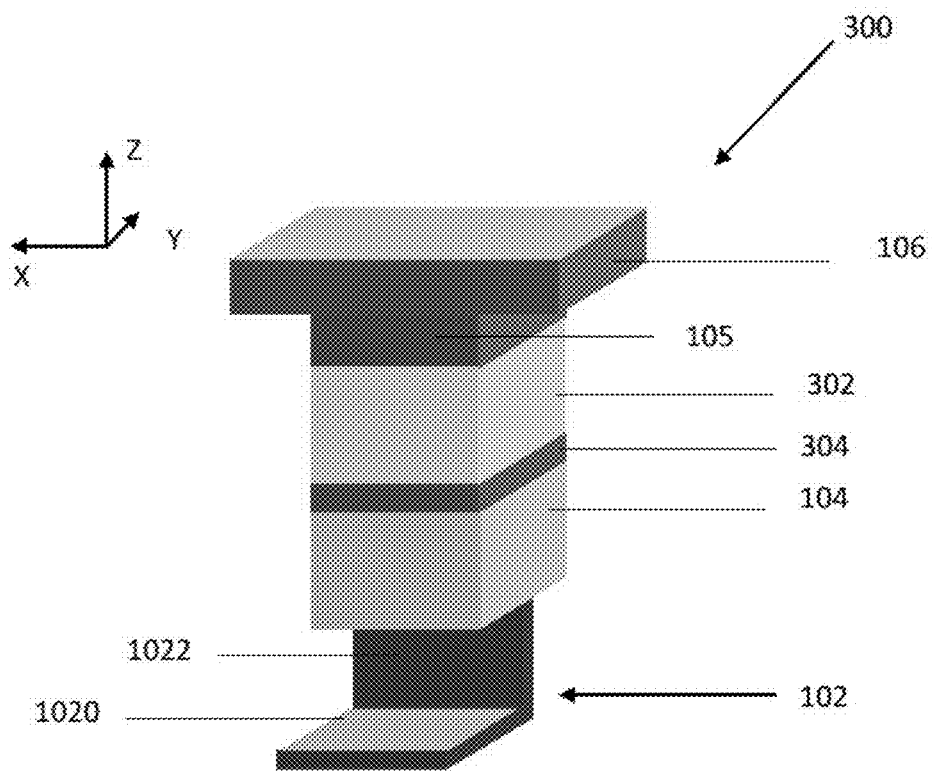
FIG. 3 illustrates a simplified cross-section view of an embodiment of a memory cell.

FIG. 3 illustrates a cross-section view of an embodiment of a memory cell 300.

Figure 4:
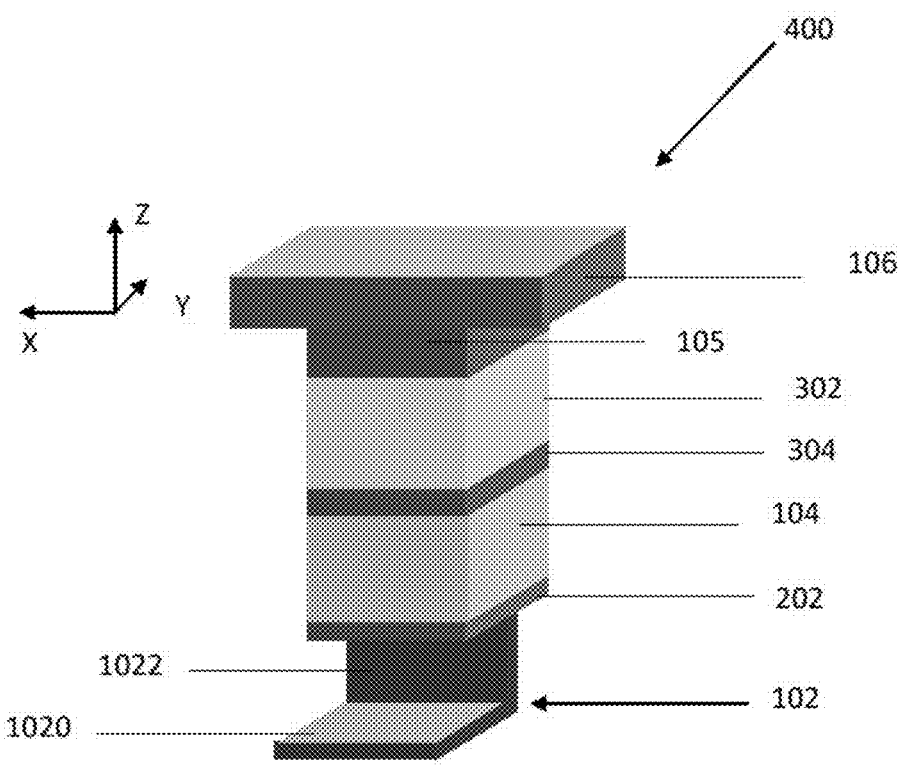
FIG. 4 illustrates a simplified cross-section view of another embodiment of a memory cell.

FIG. 4 illustrates a cross-section view of another embodiment of a memory cell 400.

The memory cell 300 illustrated in FIG. 3 and the memory cell 400 illustrated in FIG. 4 are respectively similar to the cell 100 illustrated in the FIG. 1B and the cell 200 illustrated in FIG. 2B with the difference that memory cells 300, 400 comprise a memory layer 302. The memory layer 302 is located above the OTS layer 104 and between the OTS layer 104 and the top electrode 105.

When the voltage applied to the cell is higher than a threshold voltage (VTH) of the OTS layer 104, an electrical current may flow through the OTS layer 104 and the memory layer 302 in the memory cell 300, 400 and may result in changing the resistivity of the layer 302. This change may alter the memory state of the layer 302, thus altering the electrical characteristic of the memory cell 300, 400.

The high resistive state may be associated with a "reset" state or a logic "0" value, while a low resistive state may be associated with a "set" state, or a logic "1" value.

According to the embodiment of FIGS. 3 and 4, the memory cells 300, 400 comprise a barrier layer 304 between the memory layer 302 and the OTS layer 104.

The memory layer 302 is, according to an embodiment, made of a phase change material (PCM) that switches from a high resistance state, generally amorphous, to a low resistance state, generally crystalline, upon the application of energy such as heat, light, voltage potential, or electrical current. The phase change material may be switched from completely amorphous to completely crystalline or between different detectable states of local order across the entire spectrum between completely amorphous and completely crystalline. In the case that the memory layer 302 is a PCM layer, the resistor 102 is, for example, a heating compound. The memory layer 302 is, for example, made of any phase change materials such as phase change chalcogenides. For example, the memory layer 302 is made of germanium, antimony, tellurium, or any alloy of all or some of these compounds.

The memory layer 302 is, according to another embodiment, a resistive random-access memory (RRAM) layer. The memory layer 302 is, for example, made of one or more dielectric material in which a conduction path is formed upon the application of a relatively high voltage. The memory layer 302 is, more precisely made of chalcogenides (such as the alloy $Ge_2Sb_2Te_5$ or the alloy AgInSbTe), binary transition metal oxides (such as nickel oxide and titanium dioxide), perovskites (such as $Sr(Zr)TiO_3$ and $Pr_{0.7}Ca_{0.3}MnO_3$), solid-state electrolytes (such as germanium monosulfide, germanium selenide, silicium oxide, copper sulfide), organic charge-transfer complexes (such as CuTCNQ), organic donor—acceptor systems (such as Al AIDCN), and/or two dimensional insulating materials like hexagonal boron nitride.

The memory layer 302 is, according to another embodiment, a magneto-resistive random-access memory (MRAM) layer, that means that the electric resistance of the layer 302 changes upon the application of an electronic current. The memory layer 302 is formed from two ferromagnetic layers, each of which can hold a magnetization, separated by a thin insulating layer. One of the two ferromagnetic layers, called "fixed layer", has a fixed (non-variable) magnetization direction and acts as an electron spin polarizer. The other ferromagnetic layer, called "free layer", has a direction that can be flipped (i.e., it is variable) by a relatively high programming current. The magnetization direction of the free layer can be reversed by reversing the direction of the programming current.

The memory layer 302 extends, for example, over upper the entire surface of the OTS layer 104, that means that the memory layer 302 has the same length and the same width than the length and the width of the OTS layer 104. The memory layer 302 has, for example, a thickness inclusively between 10 nm and 100 nm, preferably, between 30 nm and 60 nm.

The barrier layer 304 is, for example, a layer that limit the diffusion of the memory layer 302 into the OTS layer 104 and vice versa. The barrier layer 304 is, for example, used to limit the mix of the material of the memory layer 302 and the material of the OTS layer 104.

The barrier layer 304 is, for example, made of any conductive material and/or diffusion material, such as carbon (C) and carbon nitride ((CN)n). The barrier layer 304 is, for example, not made of a metal because of the diffusion of metal material in the OTS layer 104.

The barrier layer 304 extends, for example, upper the entire surface of the OTS layer 104, that means that the barrier layer 304 has the same length and the same width than the length and the width of the OTS layer 104 and the memory layer 302. The barrier layer 304 has, for example, a thickness inclusively between 5 nm and 30 nm, preferably, between 15 nm and 25 nm.

In the example of FIG. 3, the vertical portion 1022 of the resistor 102 is preferably centered with respect to the memory cell 300 and extends vertically along the direction X. In another embodiment, the vertical portion 1022 of the resistor 102 is preferably centered with respect to the memory cell 300 and extends vertically along the direction Y.

In the example of FIG. 4, the vertical portion 1022 of the resistor 102 is preferably centered with respect to the memory cell 400 and extends vertically along the direction X. In another embodiment, the vertical portion 1022 of the resistor 102 is preferably centered with respect to the memory cell 400 and extends vertically along the direction Y.

Figure 5:
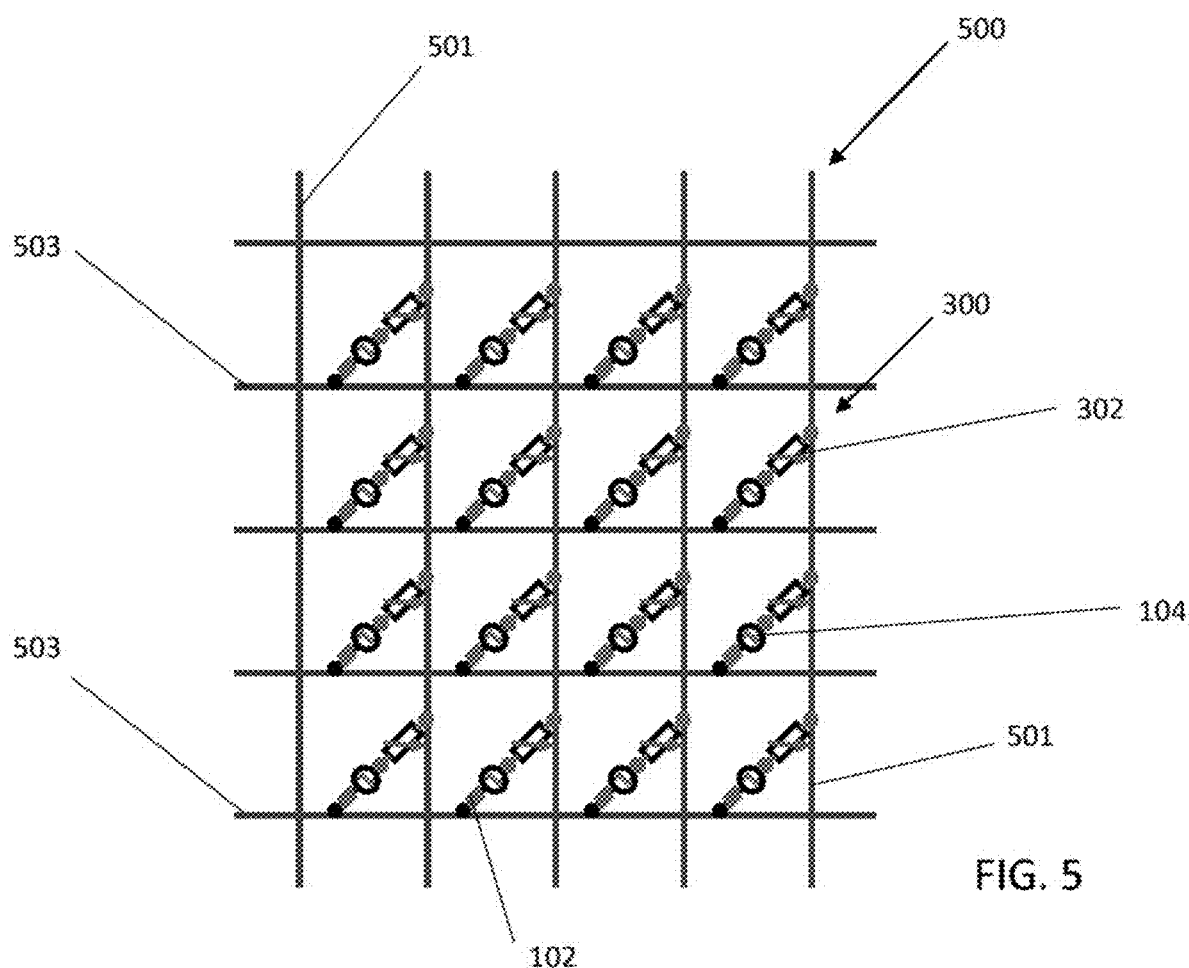
FIG. 5 illustrates a simplified schematic view of an array of memory cells.
Figure 6:
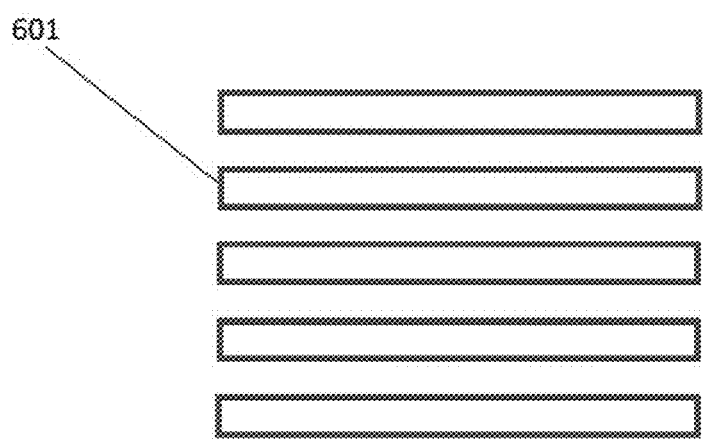
FIG. 6 illustrates, by a schematic view, a step of a manufacturing process of the array of memory cells illustrated in FIG. 5.

FIG. 5 illustrates a simplified schematic view of an array of memory cells 500.

The array of memory cells 500 comprises a plurality of memory cells such as the memory cells 300 illustrated in FIG. 3.

The memory cells 300 are, in FIG. 5, positioned between a plurality of bit lines 501 and word lines 503. In FIG. 5, bit lines 501 are illustrated with verticals lines and word lines 503 are illustrated with horizontal lines.

Each memory cell 300 includes the resistor 102, the OTS layer 104 (or OTS compound) and the memory layer 302 (or modular resistivity compound). According to an embodiment, each memory cell 300 is connected to a bit line 501 made of the conductive layer 106, by the top electrode 105 and is connected to a word line 503 by the resistor 102.

The array of memory cells 500 has been illustrated with memory cells 300, however, the array of memory cells 500 can be easily adapted to the cell 100, 200 or to the memory cell 400.

FIGS. 6 to 10 illustrate, by schematic views, steps of a manufacturing process of the array of memory cells 500 illustrated in FIG. 5.

Figure 7:
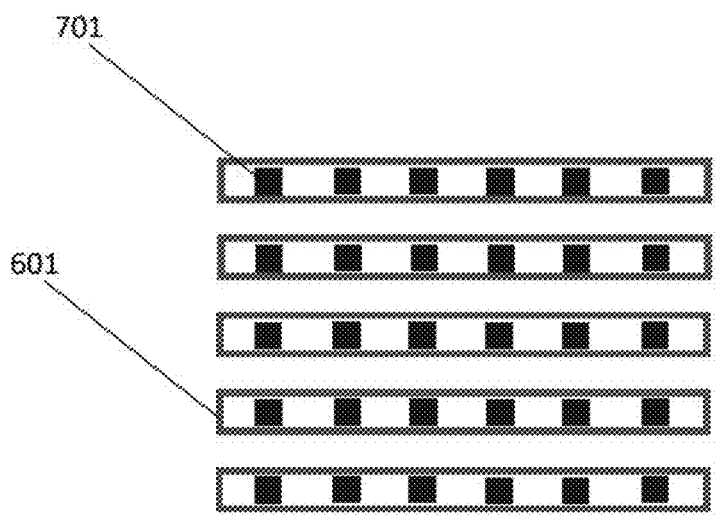
FIG. 7 illustrates, by a schematic view, another step of a manufacturing process of the array of memory cells illustrated in FIG. 5.
Figure 8:
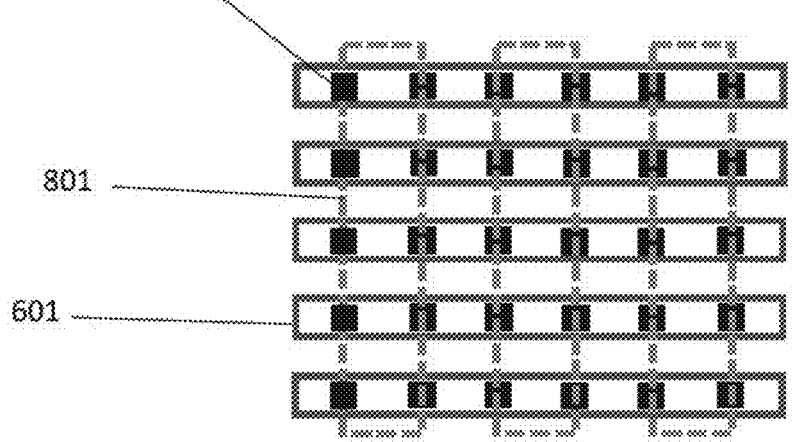
FIG. 8 illustrates, by a schematic view, another step of a manufacturing process of the array of memory cells illustrated in FIG. 5.
Figure 9:
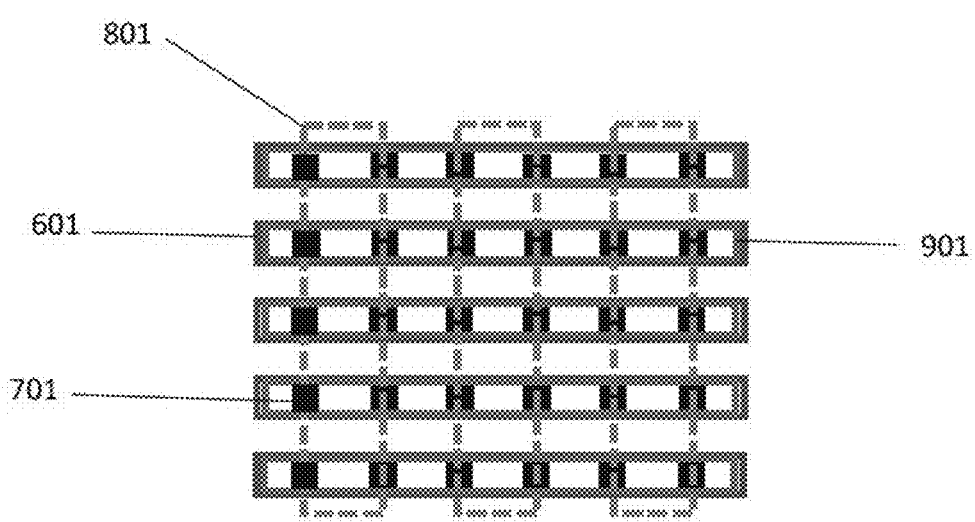
FIG. 9 illustrates, by a schematic view, another step of a manufacturing process of the array of memory cells illustrated in FIG. 5.

In the present embodiment, active areas are formed, using a mask 601 (FIG. 6), for example, following a first direction, in order to create the word lines (503, FIG. 5). Some contacts 701, are then formed on top of the active areas (FIG. 7).

For example, resistors 102 are formed, through a mask 801 (FIG. 8), for example, following a second direction, orthogonal to the first direction. After the formation of the resistor 102, the OTS layer 104 and the top electrode 105 are formed. The top electrode 105, the OTS layer 104 and the resistor 102 are then patterned using the "self-aligned wall" technology with the mask 901. After the deposition of an insulating layer and its removing with chemical mechanical polishing in order to expose the top electrode, the conductive layer 106 is deposited in order to form the bit lines (501, FIG. 5).

For example, the conductive layer 106, the top electrode 105 and the OTS layer 104 are formed with the mask 1001. The conductive layer 106 forms the bit lines (501, FIG. 5).

The masks are temporary masks, which are positioned for the concerned steps and which are then removed as it is usual in microelectronic industry.

An advantage of including a resistor 102 in each cell of the array is that it permits to limit an overshoot of current which typically appears during threshold and which disturbs the cell.

Another advantage of the present application is that it increases the lifetime of the cell.

Various embodiments and variants have been described. Those skilled in the art will understand that certain features of these embodiments can be combined, and other variants will readily occur to those skilled in the art.

Finally, the practical implementation of the embodiments and variants described herein is within the capabilities of those skilled in the art based on the functional description provided hereinabove.

The invention claimed is:

1. An electronic cell, comprising:
   an integrated stack including, successively:
      a first electrode;
      an ovonic threshold switch layer in direct contact with the first electrode;
      a second electrode in direct contact with the ovonic threshold switch layer; and
      a resistor having a fixed resistance connected to the second electrode;
      wherein the resistor has an L-shaped cross-section including a horizontal portion and a vertical portion positioned between the horizontal portion and the second electrode; and
      wherein a first end of the vertical portion directly contacts the second electrode and a second end contacts the horizontal portion.

2. The electronic cell according to claim 1, wherein a lower surface of the ovonic threshold switch layer is in contact with an upper surface of the second electrode, and wherein the upper and lower surfaces have same dimensions.

3. The electronic cell according to claim 1, further comprising a memory layer between the first electrode and the ovonic threshold switch layer.

4. The electronic cell according to claim 3, further comprising a barrier layer between the memory layer and the ovonic threshold switch layer.

5. The electronic cell according to claim 3, wherein the memory layer is made of a phase change material.

6. The electronic cell according to claim 3, wherein the memory layer is a resistive random-access memory layer.

7. The electronic cell according to claim 3, wherein the memory layer is a magneto-resistive random-access memory layer.

8. The electronic cell according to claim 3, wherein a lower surface of the first electrode is in contact with an upper surface of the memory layer, and wherein the upper and lower surfaces have same dimensions.

9. The electronic cell according to claim 1, wherein the L-shaped cross-section of the resistor is self aligned with a shape of the ovonic threshold switch layer.

10. The electronic cell according to claim 1, wherein said cell is part of a memory including a word line and a bit line, and wherein the cell is connected to the word line by said resistor and is connected to the bit line by said first electrode.

11. The electronic cell according to claim 1, wherein an upper surface of the ovonic threshold switch layer is in contact with a lower surface of the first electrode, and wherein the upper and lower surfaces have same dimensions.

12. The electronic cell according to claim 1, wherein the ovonic threshold switch layer is made of a chalcogenide material selected from the group consisting of: germanium, tellurium, selenium, tungsten, antimony, arsenic, indium, sulfur or any combination or alloy of these materials.

13. The electronic cell according claim 1, wherein a second end of the vertical portion of the resistor directly contacts the horizontal portion of the resistor.

14. The electronic cell according to claim 1, further comprising:
   a conductive layer coupled to the first electrode;
   wherein the vertical portion of the resistor is centered with respect to the electronic cell and extends vertically along a first direction perpendicular to the horizontal portion;
   wherein a width of the resistor is equal to a respective width of the conductive layer; and
   wherein the resistor and the conductive layer are formed using a same masking layer and in the same first direction.

15. The electronic cell according to claim 14, wherein the conductive layer is in direct contact with the first electrode through a conductive via smaller than the first electrode.

16. The electronic cell according to claim 1, further comprising:
   a conductive layer coupled to the first electrode;
   wherein the vertical portion of the resistor is centered with respect to the electronic cell and extends vertically along a second direction perpendicular to the horizontal portion;
   wherein a width of the resistor is different from a respective width of the conductive layer; and
   wherein the resistor and the conductive layer are formed using a first and second masking layers oriented along the second direction and a first direction perpendicular to the second direction.

17. The electronic cell according to claim 16, wherein the conductive layer is in direct contact with the first electrode through a conductive via smaller than the first electrode.

18. A memory array, comprising:
   word lines;
   bit lines;
   a plurality of cells coupled between the word lines and bit lines;
   wherein each cell comprises:
      an integrated stack including, successively:
         a first electrode;
         an ovonic threshold switch layer in direct contact with the first electrode;
         a second electrode in direct contact with the ovonic threshold switch layer; and
         a resistor having a fixed resistance connected to the second electrode;
         wherein the resistor has an L-shaped cross-section including a horizontal portion and a vertical portion positioned between the horizontal portion and the second electrode; and
         wherein a first end of the vertical portion directly contacts the second electrode and a second end contacts the horizontal portion;
   wherein each cell is connected to one of the word lines by said resistor and is connected to one of the bit lines by said first electrode.

* * * * *